US008648445B2

(12) United States Patent
Shibib et al.

(10) Patent No.: US 8,648,445 B2
(45) Date of Patent: Feb. 11, 2014

(54) METAL-OXIDE-SEMICONDUCTOR DEVICE HAVING TRENCHED DIFFUSION REGION AND METHOD OF FORMING SAME

(75) Inventors: Muhammed Ayman Shibib, Wyomissing, PA (US); Shuming Xu, Schnecksville, PA (US)

(73) Assignee: Agere Systems LLC, Allentown, PA (US)

( * ) Notice: Subject to any disclaimer, the term of this patent is extended or adjusted under 35 U.S.C. 154(b) by 0 days.

(21) Appl. No.: 13/428,540

(22) Filed: Mar. 23, 2012

(65) Prior Publication Data

US 2012/0175702 A1     Jul. 12, 2012

Related U.S. Application Data

(62) Division of application No. 11/999,168, filed on Dec. 4, 2007, now Pat. No. 8,153,484, which is a division of application No. 10/953,018, filed on Sep. 29, 2004, now abandoned.

(51) Int. Cl.
*H01L 29/78* (2006.01)

(52) U.S. Cl.
USPC ...... 257/623; 257/496; 257/622; 257/E29.04; 257/E29.052; 257/E29.267

(58) Field of Classification Search
None
See application file for complete search history.

(56) References Cited

U.S. PATENT DOCUMENTS

| 5,675,164 | A | * | 10/1997 | Brunner et al. | 257/331 |
| 5,831,312 | A |   | 11/1998 | Wen | 257/360 |
| 5,866,457 | A | * | 2/1999 | Wen | 438/275 |
| 6,013,551 | A |   | 1/2000 | Chen et al. | 438/264 |
| 6,515,348 | B2 |  | 2/2003 | Hueting et al. | 257/623 |
| 6,597,026 | B2 | * | 7/2003 | Ogura | 257/287 |
| 6,998,680 | B2 | * | 2/2006 | Kitamura et al. | 257/342 |
| 2001/0008788 | A1 |  | 7/2001 | Hshieh et al. | 438/270 |
| 2004/0108551 | A1 | * | 6/2004 | Kitamura et al. | 257/342 |

FOREIGN PATENT DOCUMENTS

| JP | H05110083 A | 4/1993 |
| JP | H05218415 A | 8/1993 |
| JP | H05315613 A | 11/1993 |
| JP | 2002118255 A | 4/2002 |
| KR | 1998048864 A | 9/1998 |

OTHER PUBLICATIONS

Y. Zhu et al., "Folded Gate LDMOS Transistor with Low On-Resistance and High Transconductance," IEEE Transactions on Election Devices, vol. 48, No. 12, pp. 2917-2928, Dec. 2001.

* cited by examiner

*Primary Examiner* — Calvin Lee
*Assistant Examiner* — Abul Kalam
(74) *Attorney, Agent, or Firm* — Ryan, Mason & Lewis, LLP

(57) ABSTRACT

An MOS device includes a semiconductor layer of a first conductivity type and first and second source/drain regions of a second conductivity type formed in the semiconductor layer proximate an upper surface of the semiconductor layer. The first and second source/drain regions are spaced apart relative to one another. A gate is formed above and electrically isolated from the semiconductor layer, at least partially between the first and second source/drain regions. At least a given one of the first and second source/drain regions is configured having an effective width that is substantially greater than a width of a junction between the semiconductor layer and the given source/drain region.

22 Claims, 5 Drawing Sheets

METAL-OXIDE-SEMICONDUCTOR DEVICE HAVING TRENCHED DIFFUSION REGION AND METHOD OF FORMING SAME

CROSS-REFERENCE TO RELATED APPLICATION(S)

This application is a divisional of pending U.S. application Ser. No. 11/999,168 filed on Dec. 4, 2007, which is a divisional of U.S. application Ser. No. 10/953,018 filed on Sep. 29, 2004, the disclosures of which are incorporated herein by reference.

FIELD OF THE INVENTION

The present invention relates generally to semiconductor devices, and more particularly relates to a metal-oxide-semiconductor (MOS) device having improved high-frequency performance and a method of forming same.

BACKGROUND OF THE INVENTION

MOS devices, including laterally diffused MOS (LDMOS) devices, are employed in a variety of applications, such as, for example, power amplifiers in wireless communications systems. With regard to the direct current (DC) performance of LDMOS devices, it is generally desirable to have a low on-state resistance and a high transconductance. The on-state resistance of a low-voltage (e.g., breakdown voltage of less than about 10 volts) LDMOS device is dominated primarily by a resistance in a channel region of the device. For instance, in a low-voltage LDMOS device, the channel resistance accounts for about eighty percent of the total on-state resistance of the device. In comparison, the on-state resistance of a high-voltage power MOS field-effect transistor (MOSFET) device is dominated primarily by a resistance of a drift region in the device.

To achieve a low on-state resistance and/or higher power handling capability, a wider channel is typically required. However, forming a device having a wider channel will consume more chip area due to the planar nature of the device. Moreover, an output capacitance of the device, which is a function of a perimeter of a P-N junction in the device, will increase accordingly as a function of the channel width. The increase in output capacitance of the device undesirably affects high-frequency performance of the LDMOS device (e.g., above about 1 gigahertz (GHz)).

It is known to increase the channel width of an LDMOS without necessarily consuming significant additional chip area by employing a folded gate LDMOS structure, as described in a paper by Yuanzheng Zhu et al., entitled "Folded Gate LDMOS Transistor with Low On-Resistance and High Transconductance," *IEEE Transactions on Electron Devices*, Vol. 48, No. 12, December 2001, which is incorporated by reference herein. However, while the folded gate configuration of the LDMOS device may produce a device having reduced on-state resistance without significantly increasing chip area, this methodology provides essentially no benefit in improving high-frequency performance since the perimeter of the P-N junction in the device, and thus junction capacitance, remains the same as if the channel region were formed substantially planar.

There exists a need, therefore, for an MOS device capable of improved high-frequency performance and on-state characteristics that does not suffer from one or more of the above-noted deficiencies typically affecting conventional MOS devices. Furthermore, it would be desirable if such an MOS device was fully compatible with standard integrated circuit (IC) process technology.

SUMMARY OF THE INVENTION

The present invention provides techniques for reducing the on-state resistance of an MOS device without significantly increasing output capacitance in the device, thereby improving high-frequency performance and DC performance of the device. Moreover, the techniques of the present invention can be used to fabricate an IC device, for example, an LDMOS device, using conventional CMOS-compatible process technology. Consequently, the cost of manufacturing the IC device is not significantly increased.

In accordance with one aspect of the invention, an MOS device includes a semiconductor layer of a first conductivity type and first and second source/drain regions of a second conductivity type formed in the semiconductor layer proximate an upper surface of the semiconductor layer. The first and second source/drain regions are spaced apart relative to one another. A gate is formed above and electrically isolated from the semiconductor layer, at least partially between the first and second source/drain regions. At least a given one of the first and second source/drain regions is configured having an effective width that is substantially greater than a width of a junction between the semiconductor layer and the given source/drain region.

The given source/drain region may include a plurality of trenches formed in the semiconductor layer proximate the upper surface of the semiconductor layer. A spacing of the trenches is arranged such that a wall separating two adjacent trenches is comprised substantially entirely of material of the second conductivity type. In this manner, a junction capacitance associated with the MOS device is substantially independent of a depth of the trenches, and instead is a function of a linear width of the given source/drain region. An on-state resistance in the MOS device is therefore advantageously reduced without any significant increase in the junction capacitance of the device.

In accordance with another aspect of the invention, a method of forming a metal-oxide-semiconductor device is provided which includes the steps of forming first and second source/drain regions of a first conductivity type in a semiconductor layer of a second conductivity type, the first and second source/drain regions being formed proximate an upper surface of the semiconductor layer and spaced apart relative to one another; and forming a gate above and electrically isolated from the semiconductor layer, the gate being formed at least partially between the first and second source/drain regions. At least a given one of the first and second source/drain regions is formed having an effective width that is substantially greater than a width of a junction between the semiconductor layer and the given source/drain region.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative CMOS semiconductor fabrication technology suitable for forming DMOS transistors, as well as other devices and/or circuits. It should be appreciated, however, that the present invention is not limited to the fabrication of this or any particular device or circuit. Rather, the invention is more generally applicable to an MOS device comprising a novel trenched diffusion arrangement which advantageously improves electrical performance (e.g., reduced on-state resistance) and high-frequency performance of the device without significantly increasing the amount of chip area consumed by the device.

Although implementations of the present invention are described herein with specific reference to an MOS device and a complementary metal-oxide-semiconductor (CMOS) fabrication process, it is to be appreciated that the techniques of the present invention are similarly applicable to other fabrication processes (e.g., bipolar) and/or the formation of other devices, such as, but not limited to, a bipolar junction transistor (BJT), a vertical diffused MOS (DMOS) device, an extended drain MOS field-effect transistor (MOSFET) device, etc., with or without modifications thereto, as will be understood by those skilled in the art. Furthermore, although the invention will be described herein in the context of an N-channel MOS device, it is well understood by those skilled in the art that a P-channel MOS device could be formed by simply substituting opposite polarities to those given for the N-channel embodiment, and that the techniques and advantages of the present invention will similarly apply to the alternative embodiment.

It is to be understood that the various layers and/or regions shown in the accompanying figures may not be drawn to scale, and that one or more semiconductor layers and/or regions of a type commonly used in such integrated circuit structures may not be explicitly shown in a given figure for ease of explanation. This does not imply that the semiconductor layer(s) and/or region(s) not explicitly shown are omitted in the actual integrated circuit structure.

Figure 1:
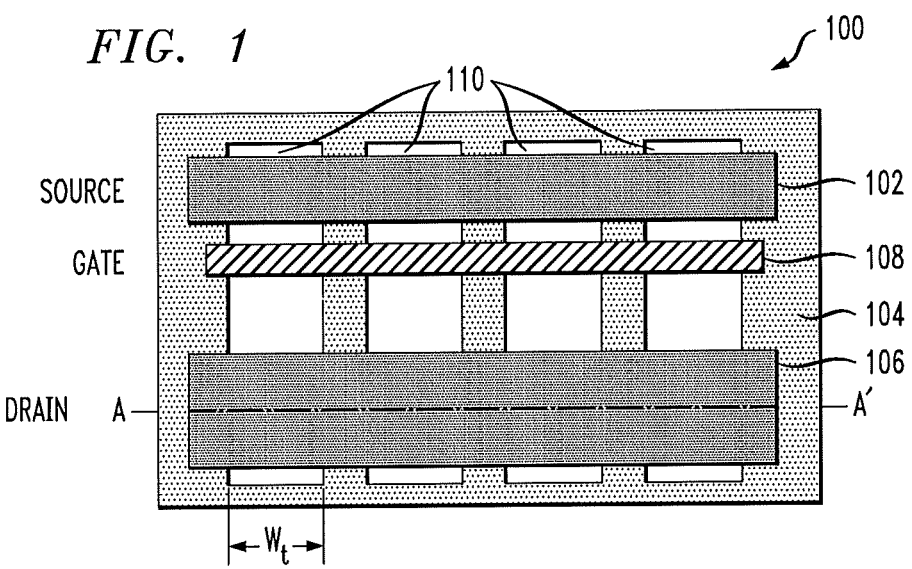
FIG. 1 is a top plan view depicting at least a portion of an exemplary MOS device in which the techniques of the present invention may be implemented.
Figure 2:
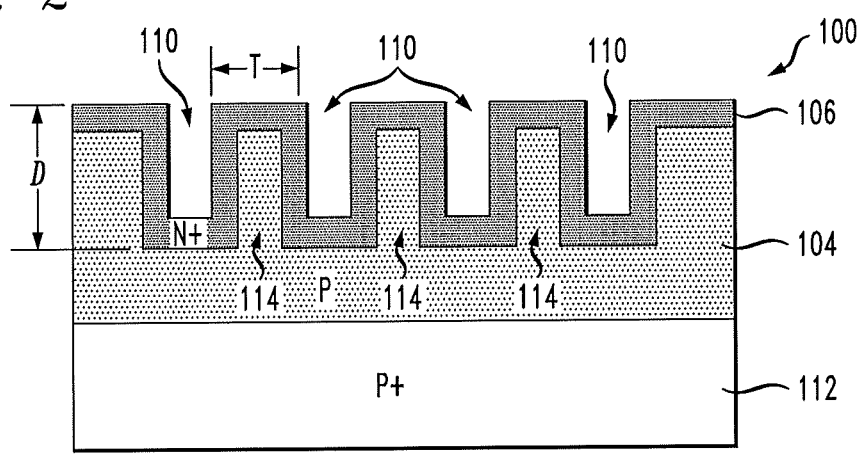
FIG. 2 is a cross-sectional view depicting at least a portion of the MOS device shown in FIG. 1 taken along line A-A'.

FIGS. 1 and 2 depict a top plan view and cross-sectional view, respectively, of at least a portion of an exemplary MOS device 100 in which the techniques of the present invention can be implemented. The MOS device 100 preferably includes an epitaxial layer 104 formed on a substrate 112. The substrate 112 is commonly formed of single-crystal silicon, although alternative materials may be used, such as, but not limited to, germanium, gallium arsenide, etc. Additionally, the substrate 112 may have been modified by adding an impurity or dopant, such as by a diffusion or implant step, to change the conductivity of the material (e.g., N-type or P-type). In a preferred embodiment of the invention, the substrate 112 is of P-type conductivity that is heavily doped, often represented with a "+" designation, and hence may be referred to as a P+ substrate. The P+ substrate 112 may be formed by adding a P-type impurity or dopant (e.g., boron) of a desired concentration (e.g., about $5 \times 10^{18}$ to about $5 \times 10^{19}$ atoms per cubic centimeter) to the substrate material, such as by a diffusion or implant step. The epitaxial layer 104 is preferably doped with a P-type impurity of a known concentration level to selectively change the conductivity of the material as desired. Alternatively, the epitaxial layer 104 can be formed as a P-type diffused layer using, for example, a conventional diffusion process. The doping concentration of the epitaxial layer 104 is preferably lower (e.g., about $10^{15}$ to about $10^{16}$ atoms per cubic centimeter) in comparison to the doping concentration of the substrate 112.

The term "semiconductor layer" as may be used herein refers to any semiconductor material upon which and/or in which other materials may be formed. The semiconductor layer may be formed on the substrate 112 and may comprise a single layer, such as, for example, epitaxial layer 104, or it may comprise multiple layers of different materials and/or layers of the same material having different doping concentrations.

Source and drain regions 102 and 106, respectively, are formed in the epitaxial layer 104 proximate an upper surface of the epitaxial layer and spaced apart relative to one another. The source and drain regions 102, 106 are preferably doped, such as by using an implant or diffusion process, with an impurity (e.g., phosphorus, arsenic, etc.) of a known concentration level to selectively change the conductivity of the material as desired. Preferably, the source and drain regions 102, 106 have a conductivity type associated therewith which is opposite a conductivity type of the epitaxial layer 104, so that active regions can be formed in the device. In a preferred embodiment of the invention, the source and drain regions 102, 106 are of N-type conductivity that are heavily doped, and hence may be referred to as N+ source and drain regions. A boundary between the N+ source and drain regions 102, 106 and the P-type epitaxial layer 104 may be referred to herein as a P-N junction.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where the term "source/drain" in this context denotes a source region or a drain region.

A gate 108 is formed above the epitaxial layer 104 and is at least partially disposed between the source and drain regions 102, 106. The gate 108 is typically formed on an insulating layer (not shown), preferably an oxide (e.g., silicon dioxide), that is formed on at least a portion of the epitaxial layer so as to electrically isolate the gate from the source and drain regions 102, 106. The gate 108 is preferably formed of an electrically conductive material, such as, for example, polysilicon material, although suitable alternative materials (e.g., metal, etc.) may be similarly employed. A resistance of the gate 108 may be reduced by applying a silicide layer (not shown) to the gate, which may be particularly beneficial for use in certain high-frequency applications. A channel region (not shown) is formed in a body region (not shown) of the MOS device 100, proximate the gate 108, primarily from electrons that are gathered by the action of a positive potential applied to the gate. Although not shown, a lightly doped drain (LDD) region may be formed in the epitaxial layer 104, proximate the upper surface of the epitaxial layer and disposed between the gate 108 and the drain region 106.

It is desirable to increase electrical conduction, and thereby decrease on-state resistance, in the MOS device 100. One method of increasing the conduction of the MOS device is to increase an effective channel width Weff of the device. To accomplish this, a plurality of trenches 110 can be formed in the epitaxial layer 104, each of the trenches extending horizontally (e.g., in a plane substantially parallel to the substrate 112) between the source and drain regions 102, 106. With reference to FIG. 2, which is a cross-sectional view of at least a portion of the drain region 106 of the exemplary MOS device 100 taken along line A-A' in FIG. 1, the presence of the trenches 110 essentially increases an effective width of the device by increasing a surface area of the device, without consuming any significant additional chip area. For example, by making a depth D of each trench 110 substantially equal to a width $W_t$ of the trench, a density of the channel region in the MOS device 100 is effectively doubled, leading to a transconductance enhancement and on-state resistance reduction. A device employing a similar methodology for increasing surface area, which can be referred to as a folded gate LDMOS device, is described in the paper by Yuanzheng Zhu et al., entitled "Folded Gate LDMOS Transistor with Low On-Resistance and High Transconductance," which was previously cited.

However, while the folded gate LDMOS structure may provide certain benefits in reducing on-state resistance without consuming any significant additional chip area, this arrangement provides substantially no benefit in improving high-frequency performance of the device. This is due primarily to the fact that a junction capacitance Cj of the device, which is a function of a width of the P-N junction in the device, scales with the effective width of the MOS device. A reduction in the junction capacitance in the MOS device 100 is independent of the trench depth, and thus the junction capacitance in the MOS device 100 remains essentially the same as if the channel region was formed substantially planar (e.g., non-trenched).

The width of the P-N junction may be determined by summing the perimeter of the N+ drain region 106 which overlaps the P-type epitaxial region 104 along the trenches 110 throughout the width of the channel region. Note that, while shown as a two-dimensional cross section in FIG. 2, the trenches 110 actually extend three-dimensionally between the source and drain regions 102, 106 in the device. Thus, the capacitance contribution of a given trench 110 will be a function of the perimeter of the P-N junction in the trench, which is about twice the trench depth plus the trench width (e.g., $2D+W_t$). Likewise, the capacitance contribution associated with each portion of the drain region 106 between two adjacent trenches 110, which may be referred to herein as a mesa 114, is a function of the perimeter of the P-N junction in the mesa, which for this embodiment is about twice the trench depth plus a thickness T of the mesa (e.g., 2D+T).

Figure 3:
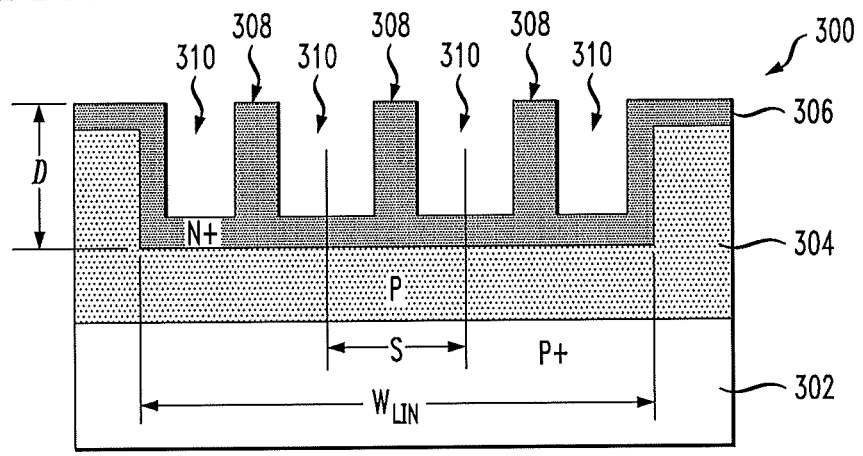
FIG. 3 is a cross-sectional view depicting at least a portion of the MOS device shown in FIG. 1 taken along line A-A', in which the techniques of the present invention are implemented.

FIG. 3 is a cross-sectional view of at least a portion of an exemplary MOS device 300, in which the techniques of the present invention are implemented. The MOS device 300 is configured so as to advantageously increase electrical conduction in the device, thereby reducing on-state resistance, without consuming additional chip area and without significantly increasing a junction capacitance of the device. Thus, junction capacitance Cj is not scaled with the effective channel width Weff of the device. Consequently, the MOS device 300 will provide enhanced high-frequency performance in comparison to standard MOS devices. To accomplish this, the exemplary MOS device 300 is formed such the effective width Weft; at least for purposes of determining the conduction of the device, is substantially greater than a width of the P-N junction in the device.

Like the MOS device 100 depicted in FIG. 2, exemplary MOS device 300 comprises a P+ substrate 302 and a P-type epitaxial layer 304 formed on the substrate. A plurality of trenches 310 are formed in the epitaxial layer 304 so as to increase a surface area of the device, as previously explained. An N+ drain region 306 is formed in the epitaxial layer, such as, for example, by using an implant and/or diffusion process. The drain region 306 is formed proximate an upper surface of the MOS device 300 and will therefore substantially follow the corrugated upper surface contour of the device resulting from the trenches 310. While only the drain region of the MOS device 300 is shown in FIG. 3, it is to be understood that a source region of the device may be formed in a similar manner. In the case of an LDMOS device, wherein the source region is typically electrically connected to the substrate, the capacitance contribution of the source region will generally be negligible.

Unlike the arrangement of the MOS device 100 shown in FIG. 2, in the exemplary MOS device 300 a spacing S of the trenches 310 is beneficially configured such that, after forming the drain region 306, mesas 308 between each pair of adjacent trenches are comprised substantially entirely of material having N-type conductivity. The effective width Weff of the MOS device 300 will be determined as a function of a depth and number of the trenches 310 in the device. Since there will be essentially no P-N junctions formed in the mesas 308, the junction capacitance contributions of the mesas to the overall output capacitance of the device will be substantially zero. Thus, the width of the P-N junction in the drain region, at least for the purpose of determining junction capacitance, will be based, at least in part, on a linear width $W_{LIN}$ of the P-N junction plus twice the trench depth ($W_{LIN}$+ 2D), throughout the drain region.

Typically, the linear width of the P-N junction will be substantially larger than the trench depth, and thus the junction capacitance attributable to the mesas 308 will be essentially independent of trench depth. In a preferred embodiment of the invention, a trench depth of about one micrometer (μm) to about 50 μm may be employed, with an electrical conduction of the MOS device 300 increasing as a function of the trench depth. For the exemplary MOS device 300 shown in FIG. 3, a reduction in P-N junction capacitance Cj, in proportion to the effective width Weff of the device, is achieved based at least in part on the following expression:

$$C_j \propto \text{Weff}-2nD,$$

where n is the number of trenches employed and D is the depth of the trenches. As can be seen from the above expression, for a given effective width Weff, the junction capacitance Cj of the device decreases with an increasing number of trenches used in the device, as well as with an increasing depth of the trenches.

In a preferred embodiment, a cross-sectional thickness of the drain region 306 in the MOS device 300 is about 0.3 μm. Since the N-type impurity used to form the drain region 306 will diffuse into each of the mesas 308 from the sidewalls of two adjacent trenches 310, a trench spacing of about 0.6 μm or less will insure that substantially all of the P-type epitaxial material in the mesas is consumed by the N+ drain region. It is to be understood that the MOS device 300 is not limited to a particular spacing of the trenches 310. A trench spacing greater than 0.6 μm can be utilized, for example, by increasing the cross-sectional thickness of the drain region 306 in the MOS device 300.

Figure 4:
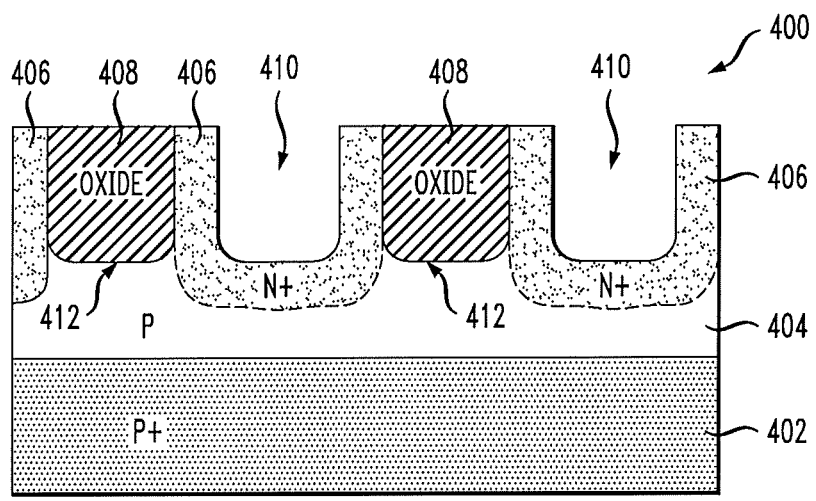
FIG. 4 is a cross-sectional view illustrating at least a portion of an exemplary MOS device, formed in accordance with another embodiment of the invention.

FIG. 4 is a cross-sectional view illustrating at least a portion of an exemplary MOS device 400, formed in accordance with another embodiment of the invention. The figure primarily depicts a drain region in the MOS device 400. Like the MOS device 300 shown in FIG. 3, the exemplary MOS device 400 is configured such that an effective width Weff of the device is substantially greater than a width of a P-N junction in the device, thereby providing a beneficial reduction in on-state resistance in the device without consuming significant additional chip area and without increasing junction capacitance in the device.

The exemplary MOS device 400 includes a P-type epitaxial layer 404 formed on a P+ substrate 402. A plurality of trenches 410 are formed in the epitaxial layer 404, proximate an upper surface of the epitaxial layer. The epitaxial region between two adjacent trenches 410 will be referred to herein as a mesa 412. A center portion of the each of the mesas 412 preferably comprises an insulating material 408, such as, for example, an oxide (e.g., silicon dioxide). The insulating material 408 is preferably formed at a depth substantially equal to a depth of the trenches 410 in the epitaxial layer 404 (e.g., about 1 μm to about 50 μm).

An N+ drain region 406 is formed in the epitaxial layer 404, such as, for example, by using an implant and/or diffusion process. As apparent from the figure, the drain region 406 is preferably formed proximate the upper surface of the epitaxial layer 404, and thus substantially follows the corrugated contour of the upper surface of the epitaxial layer resulting from the trenches 410. However, in the MOS device 400, the drain region 406 is not formed as a continuous region, but is instead formed as separate segments, with the drain region segments being separated from one another by the insulating material 408 formed in the mesas 412. The drain region segments 406 are confined predominantly to sidewalls and bottom walls of the trenches 410, and thus will assume a shape of the corresponding trenches 410. While only a cross section of the drain region 406 of the MOS device 400 is illustrated in FIG. 4, it is to be understood that the techniques of the present invention described herein may be similarly employed in forming a source region in the device.

An effective width Weff of a channel region in the MOS device 400 can be determined as a sum of the perimeters of all the drain region segments 406 in the device which, for a given trench, is a function of twice a depth D of the trench plus a width W of the trench (i.e., 2D+W). In determining junction capacitance in the MOS device 400, the width of a P-N junction in the device will essentially only be a function of the width of the trenches, since there is no P-N junction formed in the mesas 412 due to the presence of the insulating material 408. Thus, like the MOS device 300 depicted in FIG. 3, MOS device 400 is configured such that the effective width of the channel region is substantially greater than the width of the P-N junction in the drain region of the device.

Figure 5:
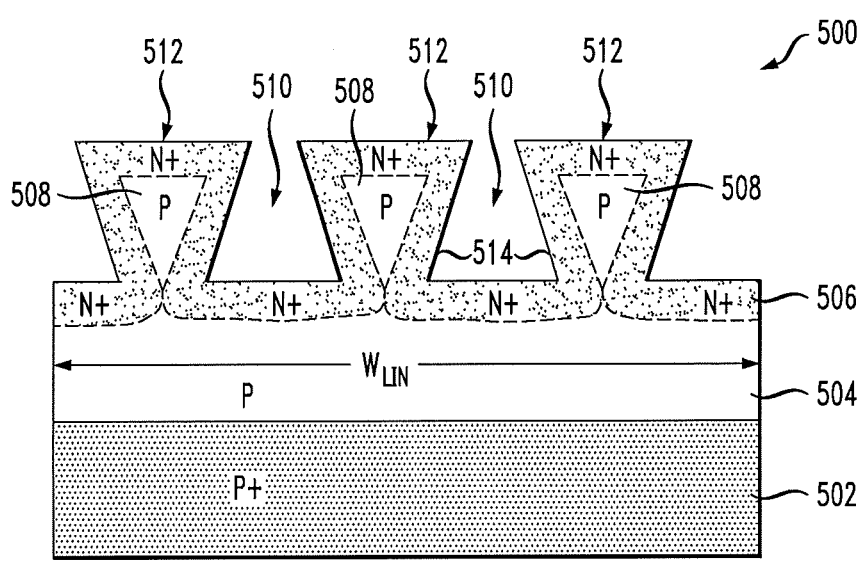
FIG. 5 is a cross-sectional view illustrating at least a portion of an exemplary MOS device, formed in accordance with a third embodiment of the invention.

FIG. 5 is a cross-sectional view depicting at least a portion of an exemplary MOS device 500, formed in accordance with a third embodiment of the invention. In the figure, a cross section of a drain region 506 in the MOS device 500 is primarily shown. The MOS device 500 preferably includes a P-type epitaxial layer 504 formed on a P+ substrate 502. Like the MOS device 300 shown in FIG. 3, the MOS device 500 includes a plurality of trenches 510 formed in the epitaxial layer 504 proximate an upper surface of the epitaxial layer. In comparison to the trenches 310 in the MOS device 300 of FIG. 3, trenches 510 of MOS device 500 are preferably formed having undercut sidewalls 514, such that a bottom wall of a given trench is wider than an upper opening of the trench. Undercut sidewalls may be formed, for example, by using an anisotropic etching process. In this manner, trenches 510 having sidewalls of a desired slope (e.g., a positive and/or a negative slope) can be formed.

Preferably, a spacing between two adjacent trenches 510, in conjunction with a thickness of the N+ drain region 506, is configured so that after the drain region has been formed in the epitaxial layer 504, the portions of the drain region proximate the bottom walls of two adjacent trenches substantially merge together, so as to form a substantially continuous and horizontal P-N junction across the bottom walls of the trenches. Mesas 512, formed between adjacent trenches, will therefore comprise a center core of P-type epitaxial material 508 substantially surrounded by the N+ drain region 506 so as to electrically isolate the P-type core material 508 from the epitaxial layer 504.

An effective width Weff of a channel region in the MOS device 500 can be determined as a sum of all segments associated with the drain region 506 in the device which, for a given trench, is a function of slightly more than about twice a depth D of the trench (e.g., based on an angle of the sloped sidewalls 514) plus a width W of the trench. In determining junction capacitance in the MOS device 500, the width of a P-N junction in the device will essentially only be a function of the linear width $W_{LIN}$ of the P-N junction, since there will be no active P-N junction formed in the mesas 512 due, at least in part, to the presence of the drain region 506 essentially pinching off the P-type material 508 in the mesas. The junction capacitance attributable to the mesas 512 will be essentially zero, particularly in comparison to the total junction capacitance of the device. Thus, like the MOS devices 300 and 400 depicted in FIGS. 3 and 4, respectively, an effective width of the channel region in the MOS device 500 will be substantially greater than a width of the P-N junction in the device.

Figure 6:
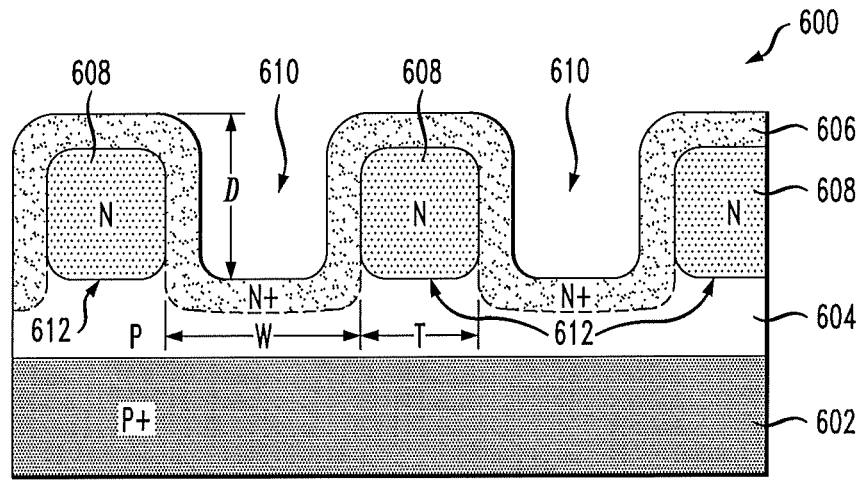
FIG. 6 is a cross-sectional view illustrating at least a portion of an exemplary MOS device, formed in accordance with a fourth embodiment of the invention.

FIG. 6 is a cross-sectional view illustrating at least a portion of an exemplary MOS device 600, formed in accordance with a fourth embodiment of the invention. The figure primarily illustrates a drain region 606 in the MOS device 600. Like the illustrative MOS device embodiments previously described in conjunction with FIGS. 3-5, the exemplary MOS device 600 is advantageously configured such that an effective width Weff of a channel region in the device is substantially greater than a width of a P-N junction in the device. This enables an electrical conductance of the MOS device 600 to be beneficially increased, thereby reducing on-state resistance, without any significant increase in junction capacitance in the device.

The MOS device 600 preferably includes a P-type epitaxial layer 604 formed on a P+ substrate 602. A plurality of trenches 610 are formed in the epitaxial layer 604 proximate an upper surface of the epitaxial layer. Mesas 612 formed between adjacent trenches 610 are preferably comprised substantially of a lightly doped N-type material 608 (e.g., arsenic or phosphorous) of a known concentration level (e.g., about $10^{14}$ to about $10^{15}$ atoms per cubic centimeter), such as by using an implant and/or diffusion process. A more heavily doped N+ drain region 606 (e.g., about $10^{15}$ to about $10^{16}$ atoms per cubic centimeter) is then formed proximate the upper surface of the epitaxial layer 604, and thus substantially follows a corrugated contour of the upper surface of the epitaxial layer resulting from the trenches 610. The corrugated drain region 606 arrangement increases an effective width of a channel region in the MOS device 600, as previously explained.

The effective width of the MOS device 600 will be determined based on a sum of the total perimeter of the drain region 606 in the device, which is a function of a depth D of the trenches 610, a width W of the trenches, and a thickness T of the mesas 612. On the other hand, a width of the P-N junction in the device can be determined primarily as a function of the perimeter of a junction between the P-type epitaxial layer 604 and the N+ drain region 606 proximate a bottom wall of each of the trenches and is substantially independent of the trench depth. A P-N junction will also be formed between the epitaxial layer 604 and the lightly doped N-type material 608 in the mesas 612. However, since the doping concentration of the N-type material 608 is significantly lower than the doping concentration of the N+ drain region 606, a junction capacitance attributable to the P-N junction associated with the mesas 612 will be substantially smaller. Like the exemplary MOS device embodiments illustrated in FIGS. 3-5, a source region (not shown) may be formed in the MOS device 600 in a manner similar to the formation of the drain region 606.

Without loss of generality, various illustrative embodiments for forming an MOS device configured to have an effective width that is substantially greater than a width of a P-N junction in the device have been described and shown herein. The techniques and advantages of the present invention can be easily expanded to form alternative devices, as will become apparent to those skilled in the art.

FIGS. 7A-7D depict steps in an illustrative methodology which may be used to form the exemplary MOS device shown in FIG. 4, in accordance with one embodiment of the present invention. The illustrative methodology will be described in the context of a conventional CMOS compatible semiconductor fabrication process technology. It is to be understood that the invention is not limited to this or any particular methodology for fabricating the device. As previously stated, the various layers and/or regions shown in the figures may not be drawn to scale and certain semiconductor layers may have been omitted for ease of explanation.

Figure 7A:
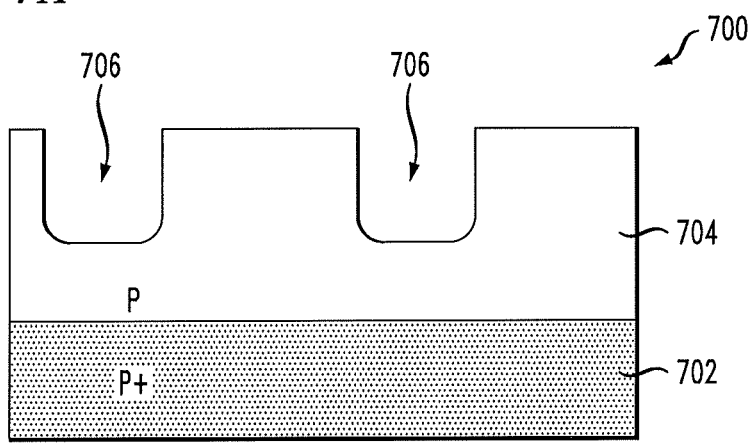
FIGS. 7A-7D depict steps in an illustrative methodology which may be used to form the exemplary MOS device shown in FIG. 4, in accordance with one embodiment of the invention.

With reference to FIG. 7A, at least a portion of an exemplary semiconductor wafer 700 is shown in which the techniques of the present invention can be implemented. The wafer 700 preferably comprises a substrate 702. The substrate 702 is preferably a P+ type substrate having a high conductivity, although an N+ type substrate may alternatively be employed. As will be understood by those skilled in the art, a P+ substrate may be formed by adding a P-type impurity or dopant (e.g., boron) of a desired concentration (e.g., about $5 \times 10^{18}$ to about $5 \times 10^{19}$ atoms per cubic centimeter) to the substrate material, such as by a diffusion or implant step, to change the conductivity of the material as desired. An epitaxial layer 704 is then preferably grown over the entire surface of the wafer 700. The epitaxial layer 704 may also be modified by adding a P-type impurity.

Figure 7B:
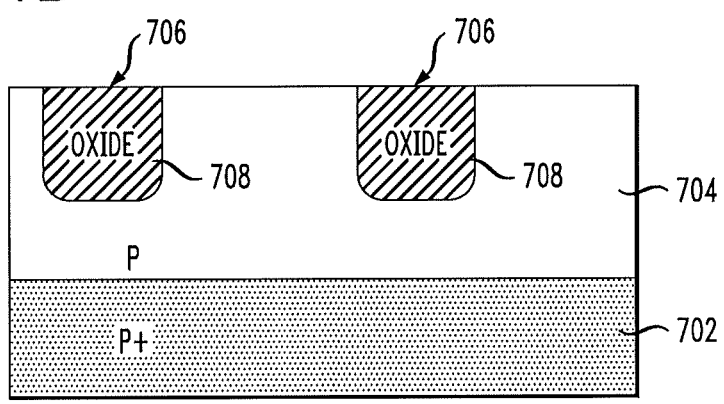

A first plurality of trenches 706 are formed in the epitaxial layer 704, such as, for example, by creating openings in the upper surface of the wafer 700 defining corresponding trenches. The openings may be formed by depositing a layer of photoresist (not shown) on the upper surface of the wafer 700 and using a conventional photolithographic patterning step followed by an etching step to remove unwanted portions of the wafer. The trenches 706 are preferably formed (e.g., using reactive ion etching (RIE), dry etching, etc.) a desired depth into the epitaxial layer 704. As shown in FIG. 7B, the trenches 706 are then filled with an insulating material, such as an oxide (e.g., silicon dioxide), to form filled oxide regions 708 using, for example, a conventional trench fill process. The filled oxide regions 708 are preferably formed to be substantially planar with the upper surface of the epitaxial layer 704.

Figure 7C:
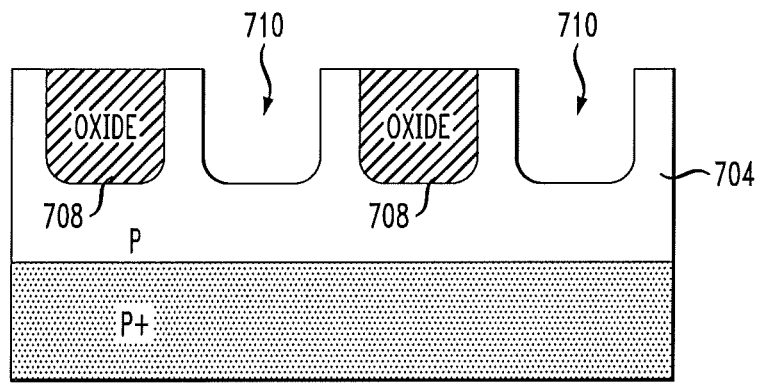
Figure 7D:
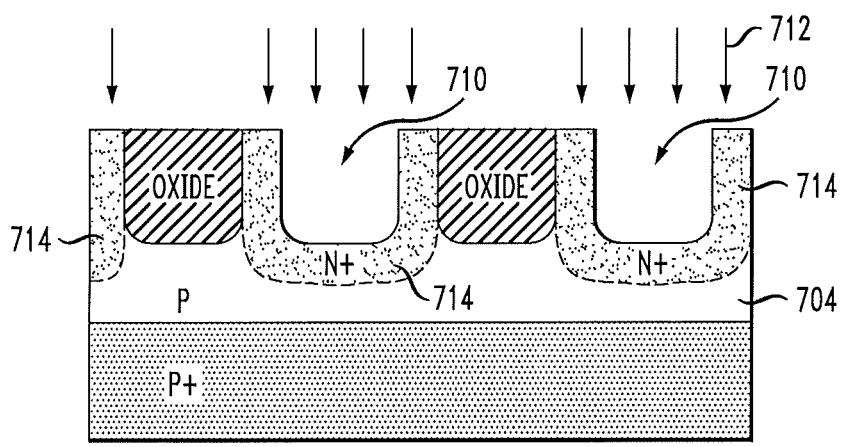

With reference to FIG. 7C, a second plurality of trenches 710 are then formed in the epitaxial layer 704, proximate the upper surface of the epitaxial layer. The second plurality of trenches 710 are preferably isolated from one another by the filled oxide regions 708, with each filled oxide region preferably being disposed between two adjacent trenches 710. As shown in FIG. 7D, a drain region 714 is subsequently formed in the epitaxial layer 704 proximate sidewalls and bottom walls of the trenches 710 by adding an N-type impurity or dopant 712 (e.g., phosphorus or arsenic) of a desired concentration (e.g., about $5 \times 10^{18}$ to about $5 \times 10^{19}$ atoms per cubic centimeter) to the epitaxial layer. The drain region 714 may be formed, for example, by using an implant or diffusion step, to change the conductivity of the material as desired.

Figure 8A:
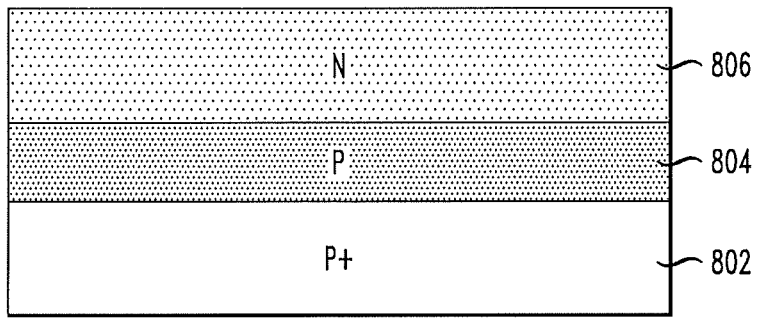
FIGS. 8A-8C depict steps in an illustrative methodology which may be used to form the exemplary MOS device shown in FIG. 6, in accordance with another embodiment of the invention.
Figure 8B:
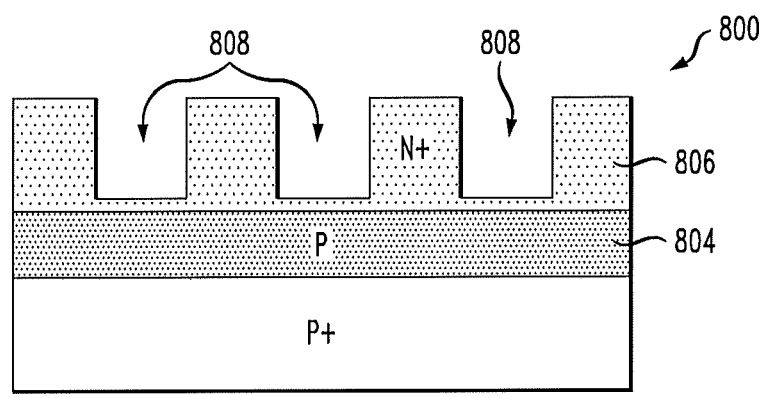
Figure 8C:
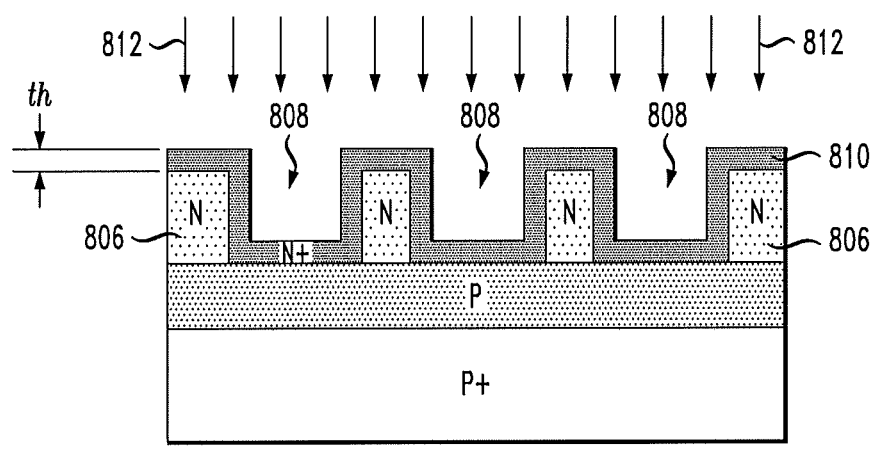

FIGS. 8A-8C depict steps in an illustrative methodology which may be used to form the exemplary MOS device shown in FIG. 6, in accordance with another embodiment of the invention. The illustrative methodology will be described in the context of a conventional CMOS compatible semiconductor fabrication process technology. It is to be understood that the invention is not limited to this or any particular methodology for fabricating the device.

With reference to FIG. 8A, at least a portion of an exemplary semiconductor wafer 800 is shown in which the techniques of the present invention can be implemented. The wafer 800 preferably comprises a substrate 802. The substrate 802 is preferably a P+ type substrate having a high conductivity, although an N+ type substrate may alternatively be employed. As will be understood by those skilled in the art, a P+ substrate may be formed by adding a P-type impurity or dopant (e.g., boron) of a desired concentration (e.g., about $5 \times 10^{18}$ to about $5 \times 10^{19}$ atoms per cubic centimeter) to the substrate material, such as by a diffusion or implant step, to change the conductivity of the material as desired. An epitaxial layer 804 is then preferably grown over the entire surface of the wafer 800. The epitaxial layer 804 may also be modified by adding a P-type impurity, although preferably of a lower concentration than the substrate 802. A lightly doped N-type layer 806 is preferably formed on at least a portion of the epitaxial layer 804, such as by using an implant or diffusion process to change the conductivity of the epitaxial material as desired.

As depicted in FIG. 8B, a plurality of trenches 808 are formed in the lightly doped N-type layer 806, such as, for example, by creating openings in the upper surface of the wafer 800 defining corresponding trenches. The openings may be formed by depositing a layer of photoresist (not shown) on the upper surface of the wafer 800 and using a conventional photolithographic patterning step followed by an etching step to remove unwanted portions of the wafer. The trenches 808 are preferably formed (e.g., using reactive ion etching (RIE), dry etching, etc.) a desired depth into the lightly doped N-type layer 806. The epitaxial layer 804 may be used as an etch stop when forming the trenches 808, thereby exposing at least a portion of the epitaxial layer through a bottom walls of the trenches, although the epitaxial layer need not be exposed.

With reference to FIG. 8C, a drain region 810 is subsequently formed in the lightly doped N-type layer 806 by adding an N-type impurity or dopant 812 (e.g., phosphorus or arsenic) of a desired concentration (e.g., about $5 \times 10^{18}$ to about $5 \times 10^{19}$ atoms per cubic centimeter) to the N-type layer. The drain region 810 is preferably formed proximate an upper surface of the wafer 800, and thus will assume a substantially corrugated contour resulting from the trenches 808. The drain region 810 may be formed, for example, by using an implant or diffusion step, to change the conductivity of the material as desired. A cross-sectional thickness th of the drain region 810 is preferably about 0.3 μm, although the drain region is not limited to any particular dimension and/or shape.

The MOS device of the present invention may be implemented at least in part in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor device, comprising:
a semiconductor layer of a first conductivity type;
at least one transistor in the semiconductor layer;
first and second source/drain regions of a second conductivity type formed in a given transistor in the semiconductor layer, the first and second source/drain regions being formed proximate an upper surface of the semiconductor layer and spaced apart relative to one another; and
a gate of the given transistor formed above and electrically isolated from the semiconductor layer, the gate being disposed at least partially between the first and second source/drain regions;
wherein at least a given one of the first and second source/drain regions of the given transistor is configured having an effective width that is substantially greater than a width of a junction between the semiconductor layer and the given source/drain region;
wherein at least the given source/drain region of the given transistor comprises a plurality of trenches formed within the given transistor in the semiconductor layer proximate the upper surface of the semiconductor layer; and
wherein each of at least a subset of the trenches comprise sloped sidewalls and a bottom wall comprising material of the second conductivity type, the sidewalls being sloped such that the bottom walls of the subset of trenches are wider than respective upper openings of the subset of trenches.

2. The device of claim 1, wherein at least one of the first and second source/drain regions comprising at least one raised mesa structure; and
wherein the at least one raised mesa structure comprises a perimeter region formed of material of the second conductivity type and having an interior region formed of material of the first conductivity type that is surrounded by the material of the second conductivity type.

3. The device of claim 1, wherein the trenches are formed by a reactive ion etching process.

4. The device of claim 1, wherein a ratio of the effective width of the device to the width of the junction between the semiconductor layer and the given source/drain region is a function of a depth of each of the trenches in the semiconductor layer.

5. The device of claim 1, wherein the subset of trenches are configured such that the bottom walls of the respective trenches form a substantially continuous region of the second conductivity type in the semiconductor layer.

6. The device of claim 1, wherein the sidewalls of two adjacent trenches are configured such that the material of the second conductivity type proximate the bottom walls of the adjacent trenches merges to form a substantially continuous region of the second conductivity type in the semiconductor layer.

7. The device of claim 1, wherein at least one of the first and second source/drain regions comprising at least one raised mesa structure; and
further comprising a wall separating two adjacent trenches being comprised substantially of an insulating material so as to substantially eliminate a junction between the semiconductor layer and the given source/drain region in the at least one mesa structure.

8. The device of claim 1, wherein the subset of the trenches in the given source/drain region of the given transistor are formed such that a width of a portion of the semiconductor layer separating two adjacent trenches is less than twice a cross-sectional thickness of the given source/drain region, such that the portion of the semiconductor layer separating the two adjacent trenches is comprised substantially of material of the second conductivity type.

9. The device of claim 1, wherein the semiconductor layer comprises an impurity of the second conductivity type proximate the upper surface of the semiconductor layer, a spacing of the trenches being configured such that at least a portion of the semiconductor layer separating two adjacent trenches in the given transistor is comprised of material of the second conductivity type.

10. The device of claim 1, wherein the first conductivity type comprises a P-type conductivity material and the second conductivity type comprises an N-type conductivity material.

11. The device of claim 1, wherein a spacing of the trenches is arranged such that a mesa separating two adjacent trenches within the given source/drain region does not include an active junction between material of the first conductivity type and material of the second conductivity type.

12. The device of claim 11, wherein the two adjacent trenches are separated only by the mesa.

13. The device of claim 1, wherein the given source/drain region extends across multiple ones of the plurality of trenches.

14. The device of claim 1, wherein a mesa separating two adjacent trenches within the given source/drain region does not include material of the first conductivity type.

15. The device of claim 1, wherein a mesa separating two adjacent trenches within the given source/drain region does not contain any portion of the gate region.

16. The device of claim 1, wherein a given one of the plurality of trenches comprises at least a portion of the first source/drain region, at least a portion of the second source/drain region and at least a portion of the gate region.

17. The device of claim 1, wherein the first and second source/drain regions are N+ source and drain regions.

18. The device of claim 1, wherein both of the first and second source/drain regions of the given transistor are configured having an effective width that is substantially greater than a width of a junction between the semiconductor layer and the first and second source/drain regions, and wherein both of the first and second source/drain regions of the given transistor comprise a plurality of trenches formed within the given transistor in the semiconductor layer proximate the upper surface of the semiconductor layer.

19. An integrated circuit comprising:
  at least one metal-oxide-semiconductor device, comprising:
    a semiconductor layer of a first conductivity type;
    at least one transistor in the semiconductor layer;
    first and second source/drain regions of a second conductivity type formed in a given transistor in the semiconductor layer, the first and second source/drain regions being formed proximate an upper surface of the semiconductor layer and spaced apart relative to one another; and
    a gate of the given transistor formed above and electrically isolated from the semiconductor layer, the gate being disposed at least partially between the first and second source/drain regions;
    wherein at least a given one of the first and second source/drain regions of the given transistor is configured having an effective width that is substantially greater than a width of a junction between the semiconductor layer and the given source/drain region; and
    wherein at least the given source/drain region of the given transistor comprises a plurality of trenches formed in the semiconductor layer proximate the upper surface of the semiconductor layer; and
    wherein each of at least a subset of the trenches comprise sloped sidewalls and a bottom wall comprising material of the second conductivity type, the sidewalls being sloped such that the bottom walls of the subset of trenches are wider than respective upper openings of the subset of trenches.

20. The integrated circuit of claim 19, wherein at least one of the first and second source/drain regions comprising at least one raised mesa structure; and
  wherein the at least one raised mesa structure comprises a perimeter region formed of material of the second conductivity type and having an interior region formed of material of the first conductivity type that is surrounded by the material of the second conductivity type.

21. The integrated circuit of claim 19, wherein the trenches are formed by a reactive ion etching process.

22. The integrated circuit of claim 19, wherein the first conductivity type comprises a P-type conductivity material and the second conductivity type comprises an N-type conductivity material.

* * * * *